United States Patent
Tieke et al.

(10) Patent No.: US 6,451,459 B1
(45) Date of Patent: Sep. 17, 2002

(54) DPP-CONTAINING CONJUGATED POLYMERS AND ELECTROLUMINESCENT DEVICES

(75) Inventors: Bernd Tieke, Brühl (DE); Thomas Beyerlein, Köln (DE); Wolfgang Brütting, Waischenfeld (DE); Stefan Ferero-Lenger, Bayreuth (DE)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 131 days.

(21) Appl. No.: 09/632,219

(22) Filed: Aug. 3, 2000

(30) Foreign Application Priority Data

Aug. 26, 1999 (EP) ............................................. 99810773

(51) Int. Cl.[7] ......................... H05B 33/14; C08G 61/12; C09K 11/06
(52) U.S. Cl. ....................... 428/690; 428/917; 313/504; 313/506; 257/40; 252/301.35; 528/367; 528/394; 528/397
(58) Field of Search ................ 428/690, 917; 313/504, 506; 257/40; 252/301.35; 528/367, 394, 397

(56) References Cited

U.S. PATENT DOCUMENTS 5,750,723 A    5/1998   Eldin et al. ................. 548/453

FOREIGN PATENT DOCUMENTS

| | | |
|---|---|---|
| EP | 0 499 011 | 8/1992 |
| EP | 0 787 730 | 8/1997 |

OTHER PUBLICATIONS

T. Beyerlein et al., "New photoluminescent conjugated polymers with . . . (DPP) and 1,4–phenylene units . . . ", Macromol. Rapid Commun. 21(4), pp. 182–189 (2000).*
J. of Amer. Chem. Soc. vol. 115, pp. 11735–11743 (1993). no month.
J. of Amer. Chem. Soc. vol. 117, pp. 12426–12435 (1995). no month.
Appl. Phys. Letters vol. 64, pp. 2489–2491 (May 1994).
Macromol. Chem. Phys. vol. 200, pp. 106–112, (1999). no month.

* cited by examiner

Primary Examiner—Marie Yamnitzky
(74) Attorney, Agent, or Firm—David R. Crichton

(57) ABSTRACT

Diketopyrrolopyrrole (DPP) based polymers and copolymers comprising the following units wherein x is chosen in the range of from 0.005 to 1, and y from 0.995 to 0, and wherein x+y=1, and
wherein $Ar^1$ and $Ar^2$ independently from each other stand for blends of such polymers and copolymers with other polymers, their use for the preparation of electroluminescent ("EL") devices and EL devices comprising such polymers or copolymers.

9 Claims, No Drawings

DPP-CONTAINING CONJUGATED POLYMERS AND ELECTROLUMINESCENT DEVICES

The present invention relates to diketopyrrolopyrrole (DPP) based polymers and copolymers comprising the following units

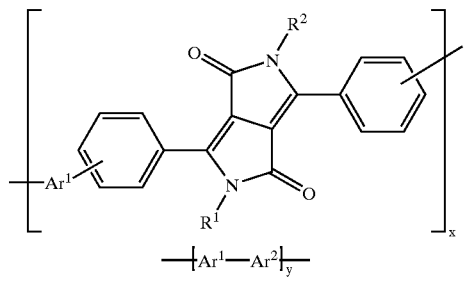

wherein x is chosen in the range of from 0.005 to 1, preferably from 0.01 to 1, and y from 0.995 to 0, preferably 0.99 to 0, and wherein x+y=1, and wherein $Ar^1$ and $Ar^2$ independently from each other stand for

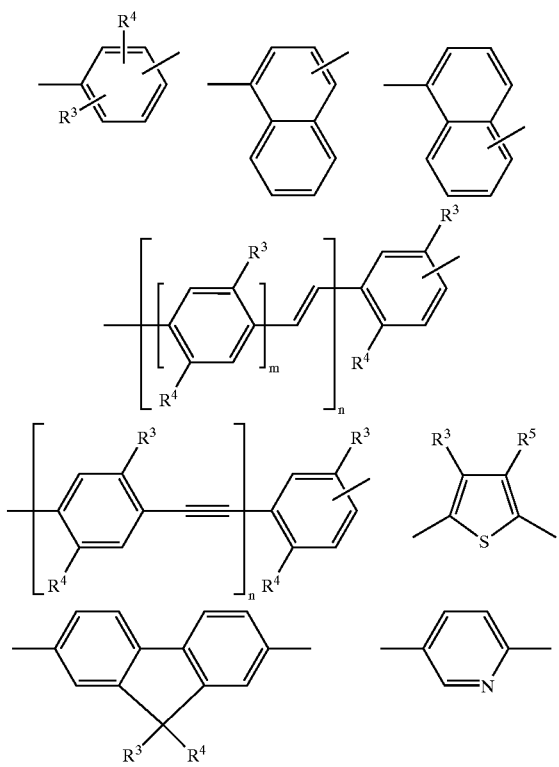

and m, n being numbers from 1 to 10, and $R^1$ and $R^2$ independently from each other stand for H, $C_1$–$C_{18}$alkyl, —C(O)O—$C_1$–$C_{18}$alkyl, perfluoro-$C_1$–$C_{12}$alkyl, unsubstituted $C_6$–$C_{12}$aryl or one to three times with $C_1$–$C_{12}$alkyl, $C_1$–$C_{12}$alkoxy, or halogen substituted $C_6$–$C_{12}$aryl, $C_1$–$C_{12}$alkyl-$C_6$–$C_{12}$aryl, or $C_6$–$C_{12}$aryl-$C_1$–$C_{12}$alkyl, $R^3$ and $R^4$ preferably stand for hydrogen, $C_1$–$C_{12}$alkyl, $C_1$–$C_{12}$alkoxy, unsubstituted $C_6$–$C_{12}$aryl or one to three times with $C_1$–$C_{12}$alkyl, $C_1$–$C_{12}$alkoxy, or halogen substituted $C_6$–$C_{12}$aryl or perfluoro-$C_1$–$C_{12}$alkyl, and $R^5$ preferably stands for $C_1$–$C_{12}$alkyl, $C_1$–$C_{12}$alkoxy, unsubstituted $C_6$–$C_{12}$aryl or one to three times with $C_1$–$C_{12}$alkyl, $C_1$–$C_{12}$alkoxy, or halogen substituted $C_6$–$C_{12}$aryl, or perfluoro-$C_1$–$C_{12}$alkyl, blends of such polymers and copolymers with other polymers, their use for the preparation of electroluminescent ("EL") devices and EL devices comprising such polymers or copolymers.

EP-A 787,730 describes a polyacrylate and a polyurethane obtained by the polymerization of a DPP of formula Ia

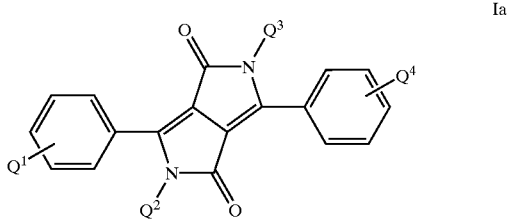

wherein $Q_1$ and $Q_4$ independently of each other stand for a polymerizable reactive group, and $Q_2$ and $Q_3$ independently of each other stand for hydrogen, $C_{12}$–$C_{24}$alkyl, $C_6$–$C_{24}$alkyl which is interrupted one or more times by O or S, or are a group of the formula

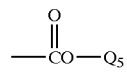

in which $Q_5$ is $C_4$–$C_{18}$alkyl or $C_5$–$C_{10}$cycloalkyl.

Though it is mentioned that compounds Ia can be used for the preparation of photo- and electroconductive polymers, no corresponding examples are given. Further, no teaching is given of how to prepare EL devices comprising DPP-based polymers and of how to select the appropriate DPP-monomers resp. DPP-polymers.

Macromol. Chem. Phys. 200 (1999) 106–112 describes fluorescent DPP-polymers obtainable by the copolymerization of bifunctional monomeric DPP-derivatives, wherein the functional groups are attached to the N-atoms of the DPP-molecule, with diisocyanates or di-ols or di-acids. No teaching is given whether the described polymers can be used in EL devices.

JACS 115 (1993) 11735–11743 describes DPP-polymers demonstrating photorefractivity, i.e. exhibiting photoconductivity and second order non-linear-optical activity. Although the photoconductive properties are measured using a device similar to an EL device, i.e. irradiating the device with a laser beam and then measuring the current resulting from this irradiation, no measurements were carried out with regard to electroluminescence. Further, no teaching is given of how to select other DPP-polymers.

Adv. Mater. 4 (1992) 36–37 describes poly(p-phenylene)-based EL devices emitting blue light. However, no teaching and no motivation are given of how to modify the used polymers. Further, $\lambda_{max}$ of electroluminescence is in the blue region.

Hence, an object of the present invention was to provide novel DPP-based polymers and copolymers, preferably exhibiting a $\lambda_{max}$ of electroluminescence which is not in the blue region, i.e. not between 400 to 470 nm, but preferably in the range of from 500 to 800, more preferably of from 600 to 750 nm, and its use in electronic and photonic devices such as diodes, light-emitting diodes, photodiodes, field-effect transistors, polymer grid triodes, light-emitting electrochemical cells, optocouplers, and lasers. Further, the intensity of the electroluminescence of the novel polymers should be improved with regard to poly(1,4-phenylene). In addition, the processability into thin films by spin-coating and solution coating of the novel polymers should be improved with regard to poly(1,4-phenylene).

Accordingly, the above-mentioned DPP-based polymers have been found.

In addition, blends comprising the inventive polymers, EL devices comprising the inventive polymers and the use of DPP I and its polymers have been found, too.

Preferably, $Ar^1$ stands for

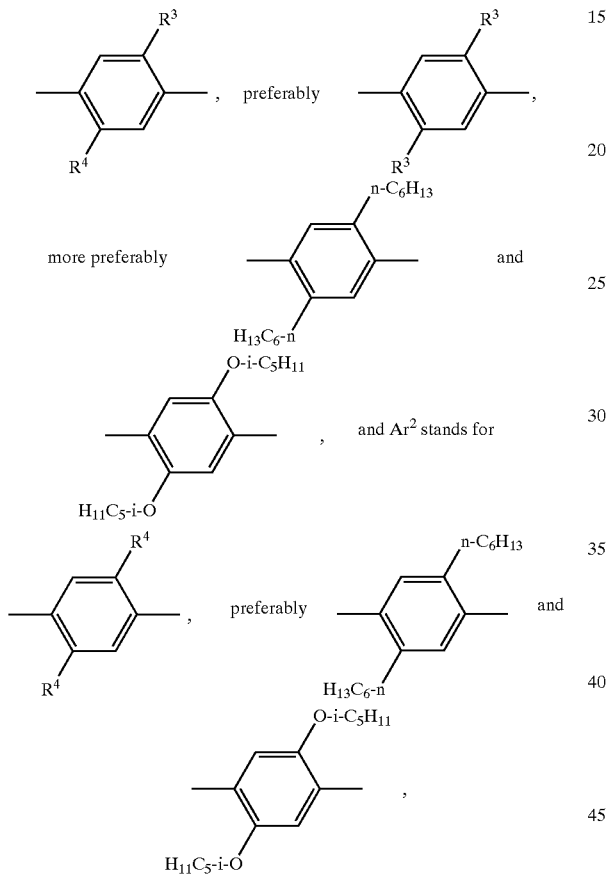

Preferably, $R^1$ and $R^2$ independently from each other stand for H, $C_1$–$C_{12}$alkyl, —C(O)O—$C_1$–$C_{12}$alkyl, perfluoro-$C_1$–$C_{12}$alkyl, unsubstituted $C_6$–$C_{12}$aryl or one to three times with $C_1$–$C_{12}$alkyl, $C_1$–$C_{12}$alkoxy, or halogen substituted $C_6$–$C_{12}$aryl, $C_1$–$C_{12}$alkyl-$C_6$–$C_{12}$aryl, or $C_6$–$C_{12}$aryl-$C_1$–$C_{12}$alkyl, $R^3$ and $R^4$ preferably stand for hydrogen, $C_1$–$C_{12}$alkyl, $C_1$–$C_{12}$alkoxy, unsubstituted $C_6$–$C_{12}$aryl or one to three times with $C_1$–$C_{12}$alkyl, $C_1$–$C_{12}$alkoxy, or halogen substituted $C_6$–$C_{12}$aryl or perfluoro-$C_1$–$C_{12}$alkyl, and $R^5$ preferably stands for $C_1$–$C_{12}$alkyl, $C_1$–$C_{12}$alkoxy, unsubstituted $C_6$–$C_{12}$aryl or one to three times with $C_1$–$C_{12}$alkyl, $C_1$–$C_{12}$alkoxy, or halogen substituted $C_6$–$C_{12}$aryl, or perfluoro-$C_1$–$C_{12}$alkyl.

A preferred embodiment concerns a copolymer comprising the following units

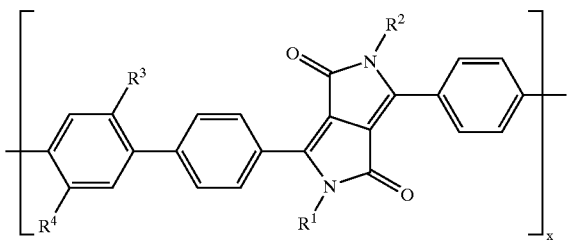

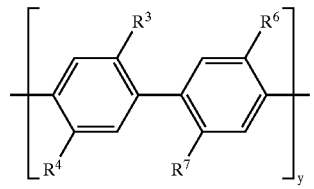

wherein $R^6$ and $R^7$, independently from each other, have the meaning of hydrogen, $C_1$–$C_{12}$alkyl, $C_1$–$C_{12}$alkoxy, unsubstituted $C_6$–$C_{12}$aryl or one to three times with $C_1$–$C_{12}$alkyl, $C_1$–$C_{12}$alkoxy, or halogen substituted $C_6$–$C_{12}$aryl or perfluoro-$C_1$–$C_{12}$alkyl, more preferably

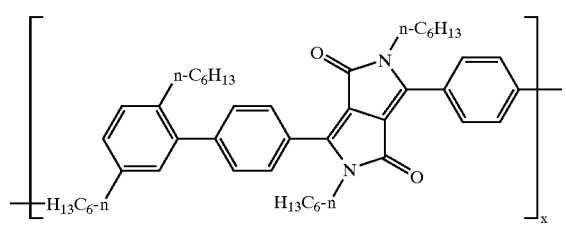

and

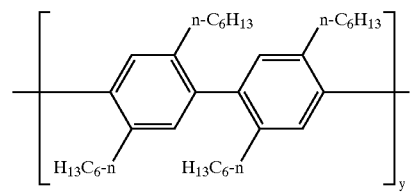

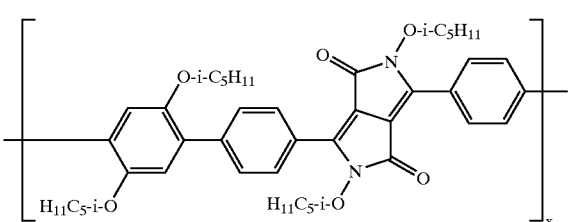

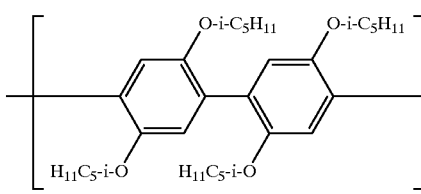

$C_1$–$C_{18}$alkyl stands for methyl, ethyl, n-, i-propyl, n-, i-, sec.-, tert.-butyl, n-, i-, neo-pentyl, n-hexyl, n-heptyl, n-octyl, 2-ethylhexyl, n-nonyl, n-decyl, 3,7-dimethyloctyl, n-undecyl, n-dodecyl, n-tridecyl, n-tetradecyl, n-pentadecyl, n-hexadecyl, n-heptadecyl, n-octadecyl, preferably for $C_1$–$C_{12}$alkyl such as methyl, ethyl, n-, i-propyl, n-, i-, sec.-, tert.-butyl, n-, i-, neo-pentyl, n-hexyl, n-heptyl, n-octyl, 2-ethylhexyl, n-nonyl, n-decyl, 3,7-dimethyloctyl, n-undecyl, or n-dodecyl.

perfluoro-$C_1$–$C_{12}$alkyl stands for fully or partially fluorinated $C_1$–$C_{12}$alkyl such as fluoromethyl, trifluoromethyl, pentafluoroethyl, heptafluoropropyl, or nonafluorobutyl.

$C_1$–$C_{12}$alkoxy stands for methoxy, ethoxy, n-, i-propoxy, n-, i-, sec.- or tert.-butoxy, n-, i-pentoxy, n-hexoxy, n-heptoxy-, n-octoxy, 2-ethylhexoxy, n-nonoxy, n-decoxy, 3,7-dimethyloctoxy, n-undecoxy, n-dodecoxy, preferably for $C_4$–$C_{12}$alkoxy such as n-, i-, sec.- or tert.-butoxy, n-, i-pentoxy, n-hexoxy, n-heptoxy-, n-octoxy, 2-ethylhexoxy, n-nonoxy, n-decoxy, 3,7-dimethyloctoxy, n-undecoxy, n-dodecoxy.

$C_6$–$C_{12}$aryl is typically phenyl, 1-naphthyl, 2-naphthyl, or 4-biphenyl.

$C_1$–$C_{12}$alkyl-$C_6$–$C_{12}$aryl stands for e.g. 2-, 3-, 4-methylphenyl, 2-, 3-, 4-ethyl-phenyl, 2-, 3-, 4-n-propyl-phenyl, 2-, 3-, 4-i-propyl-phenyl, 2-, 3-, 4-n-butyl-phenyl, 2-, 3-, 4-tert.-butyl-phenyl, 1-, 2-methyl-naphthyl, 1-, 2-ethyl-naphthyl, 1-, 2-n-propyl-naphthyl, 1-, 2-i-propyl-naphthyl, 1-, 2-n-butyl-naphthyl, 1-, 2-tert.-butyl-phenyl.

$C_6$–$C_{12}$aryl-$C_1$–$C_{12}$alkyl stands for e.g. benzyl, 2-benzyl-2-propyl, β-phenyl-ethyl, α,α-dimethylbenzyl, ω-phenylbutyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$–$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$–$C_{12}$aralkyl such as benzyl, 2-benzyl-2-propyl, ,βphenyl-ethyl, αα-dimethylbenzyl, ω-phenyl-butyl, or ω,ω-dimethyl-ω-phenyl-butyl.

The inventive polymers and copolymers (hereinafter the term polymer comprises the term copolymer) usually have a molecular weight $M_w$ in the range of from 1,000 to 1,000,000 g/mol, preferably from 2,000 to 100,000 g/mol, most preferably from 2,000 to 50,000 g/mol.

A preferred embodiment of the present invention relates to a process for the preparation of a DPP polymer, comprising the following units:

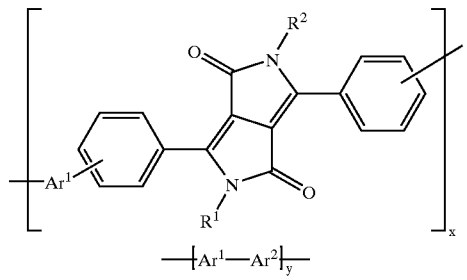

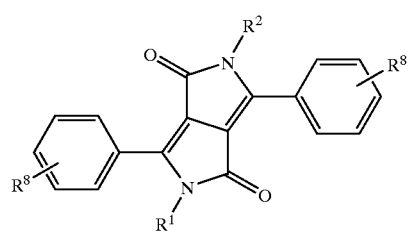

which comprises reacting a DPP derivative of formula II

II

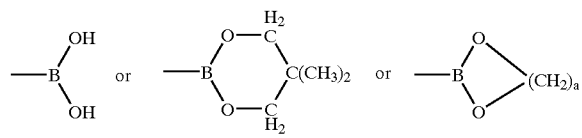

wherein
$R^8$ stands for halogen such as chloro or bromo, preferably bromo, or E having the meaning of

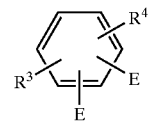

wherein a is 2 or 3,
with boronic acid derivative III

III

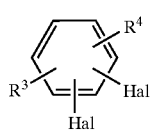

or—in case $R^8$ is not halogen—

IIIa

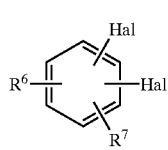

wherein Hal stands for halogen as defined above, preferably for bromo, and optionally with dihalophenyl compound IV

IV

Preferably, the reaction is carried out in the presence of an organic solvent such as an aromatic hydrocarbon or a usual polar organic solvent such as benzene, toluene, xylene, tetrahydrofurane, or dioxane, or mixtures thereof, most preferred toluene. Usually, the amount of the solvent is chosen in the range of from 1 to 10 l per mol of boronic acid derivative III.

Also preferred, the reaction is carried out under an inert atmosphere such as nitrogen, or argon.

Further, it is preferred to carry out the reaction in the presence of an aqueous base such as an alkali metal hydroxide or carbonate such as NaOH, KOH, $Na_2CO_3$, $K_2CO_3$ and the like, preferably an aqueous $K_2CO_3$ solution is chosen, Usually, the molar ratio of the base to compound III is chosen in the range of from 0.5:1 to 50:1.

Generally, the reaction temperature is chosen in the range of from 40 to 180° C., preferably under reflux conditions.

Preferred, the reaction time is chosen in the range of from 1 to 80 hours, more preferably from 20 to 72 hours.

In a preferred embodiment a usual catalyst for coupling reactions or for polycondensation reactions is used, preferably Pd-based catalyst such as known tetrakis (triarylphosphonium)-palladium, preferably $(Ph_3P)_4Pd$ and derivatives thereof. Usually, the catalyst is added in a molar ratio from inventive DPP polymer to the catalyst in the range of from 100:1 to 10:1, preferably from 50:1 to 30:1.

Also preferred, the catalyst is added as in solution or suspension. Preferably, an appropriate organic solvent such as the ones described above, preferably benzene, toluene, xylene, THF, dioxane, more preferably toluene, or mixtures thereof, is used. The amount of solvent usually is chosen in the range of from 1 to 10 l per mol of boronic acid derivative III. The obtained inventive DPP polymer can be isolated by well-known methods. Preferably, after cooling down the reaction mixture to room temperature, it is poured into acetone and the obtained precipitation preferably is filtered off, washed and dried.

DPP derivatives II are known and can be prepared according to methods known in the art, e.g. described in U.S. Pat. No. 4,579,949 or in U.S. Pat. No. 4,585,878, i.e. by reacting 2 moles of an appropriate nitrile or a Schiff base with one mole of a succinic acid diester in the presence of a base and an organic solvent.

Another embodiment of the present invention relates to electroluminescent devices comprising the inventive polymers.

Typical constitutions of latest organic electroluminescent devices are:
(i) an anode/a hole transporting layer/an electron transporting layer/a cathode,
   in which the inventive polymers are used either as positive-hole transport compounds, which is exploited to form the light emitting and hole transporting layers, or as electron transport compounds, which can be exploited to form the light-emitting and electron transporting layers, and
(ii) an anode/a hole transporting layer/a light-emitting layer/optionally an electron transporting layer/a cathode,
   in which the inventive polymers form the light-emitting layer regardless of whether they exhibit positive-hole or electron transport properties in this constitution.

It is possible that the light-emitting layer can consist of two or more inventive polymers for energy donor(s) and electron acceptor(s).

The devices can be prepared in several ways. Usually, vacuum evaporation is extensively used for the preparation. Preferably, the organic layers are laminated in the above order on a commercially available indium-tin-oxide ("ITO") or fluorinated tin-oxide ("FTO") glass substrate held at room temperature, which work as the anode in the constitutions. The membrane thickness is preferably in the range of 1 to 10,000 nm, more preferably 1 to 5,000 nm, more preferably 1 to 1,000 nm, more preferably 1 to 500 nm. The cathode metal such as Al, Ca, Mg/Ag alloy and Li—Al binary system of 30 to 200 nm is laminated on the top of the organic layers. The vacuum during the deposition is preferably 0.1333 Pa ($1\times10^{-3}$ Torr), more preferably $1.333\times10^{-3}$ Pa ($1\times10^{-5}$ Torr), more preferably $1.333\times10^{-4}$ Pa ($1\times10^{-6}$ Torr).

As anode usual anode materials which possess high work function such as metals like gold, silver, copper, aluminum, indium, iron, zinc, tin, chromium, titanium, vanadium, cobalt, nickel, lead, manganese, tungsten and the like, metallic alloys such as magnesium/copper, magnesium/silver, magnesium/aluminum, aluminum/indium and the like, semiconductors such as Si, Ge, GaAs and the like, metallic oxides such as ITO, FTO, ZnO and the like, metallic compounds such as CuI and the like, and furthermore, electroconducting polymers such polyacetylene, polyaniline, polythiophene, polypyrrole, polyparaphenylene and the like, preferably ITO or FTO, most preferably ITO or FTO on glass as substrate can be used.

Of these electrode materials, metals, metallic alloys, metallic oxides and metallic compounds can be transformed into electrodes, for example, by means of the sputtering method. In the case of using a metal or a metallic alloy as a material for an electrode, the electrode can be formed also by the vacuum deposition method. In the case of using a metal or a metallic alloy as a material forming an electrode, the electrode can be formed, furthermore, by the chemical plating method (see for example, Handbook of Electrochemistry, pp 383–387, Mazuren, 1985). In the case of using an electroconducting polymer, an electrode can be made by forming it into a film by means of anodic oxidation polymerization method onto a substrate which is previously provided with an electroconducting coating. The thickness of an electrode to be formed on a substrate is not limited to a particular value, but, when the substrate is used as a light emitting plane, the thickness of the electrode is preferably within the range of from 1 nm to 100 nm, more preferably, within the range of from 5 to 50 nm so as to ensure transparency.

In a preferred embodiment ITO is used on a substrate having an ITO film thickness in the range of from 10 nm (100 Å) to 1 μ(10000 Å), preferably from 20 nm (200 Å) to 500 nm (5000 Å). Generally, the sheet resistance of the ITO film is chosen in the range of not more than 100 $\Omega/cm^2$, preferred from not more than 50 $\Omega/cm^2$.

Such anodes are commercially available e.g. from e.g. Japanese manufacturers such as Geomatech Co.Ltd., Sanyo Vacuum Co. Ltd., Nippon Sheet Glass Co. Ltd.

As substrate either an electroconducting or electrically insulating material can be used. In case of using an electroconducting substrate, a light emitting layer or a positive hole transporting layer is directly formed thereupon, while in case of using an electrically insulating substrate, an electrode is firstly formed thereupon and then a light emitting layer or a positive hole transporting layer is superposed.

The substrate may be either transparent, semi-transparent or opaque. However, in case of using a substrate as an indicating plane, the substrate must be transparent or semi-transparent.

Transparent electrically insulating substrates are, for example, inorganic compounds such as glass, quartz and the like, organic polymeric compounds such as polyethylene, polypropylene, polymethylmethacrylate, polyacrylonitrile, polyester, polycarbonate, polyvinylchloride, polyvinylalcohol, polyvinylacetate and the like. Each of these substrates can be transformed into a transparent electroconducting substrate by providing it with an electrode according to one of the methods described above.

As examples of semi-transparent electrically insulating substrates, there are inorganic compounds such as alumina, YSZ (yttrium stabilized zirconia) and the like, organic polymeric compounds such as polyethylene, polypropylene, polystyrene, epoxy resin and the like. Each of these substrates can be transformed into a semi-transparent electroconducting substrate by providing it with an electrode according to one of the abovementioned methods.

As examples of opaque electroconducting substrates, there are metals such as aluminum, indium, iron, nickel, zinc, tin, chromium, titanium, copper, silver, gold, platinum and the like, various electroplated metals, metallic alloys such as bronze, stainless steel and the like, semiconductors such as Si, Ge, GaAs, and the like, electroconducting polymers such as polyaniline, polythiophene, polypyrrole, polyacetylene, polyparaphenylene and the like.

A substrate can be obtained by forming one of the above listed substrate materials to a desired dimension. It is preferred that the substrate has a smooth surface. Even if it has a rough surface, however, it will not cause any problem for practical use, provided that it has round unevenness having a curvature of not less than 20 μm. As for the thickness of the substrate, there is no restriction as far as it ensures sufficient mechanical strength. As cathode usual cathode materials which possess low work function such as alkali metals, earth alkaline metals, group 13 elements, silver, and copper as well as alloys or mixtures thereof such as sodium, lithium, potassium, sodium-potassium alloy, magnesium, magnesium-silver alloy, magnesium-copper alloy, magnesium-aluminum alloy, magnesium-indium alloy, aluminum, aluminum-aluminum oxide alloy, aluminum-lithium alloy, indium, calcium, and materials exemplified in EP-A 499,011 such as electroconducting polymers e.g. polypyrrole, polythiophene, polyaniline, polyacetylene etc., preferably Al, Ca, Mg/Ag alloys, or Li—Al compositions can be used.

Such cathodes can be deposited on the foregoing electron transporting layer by known vacuum deposition techniques described above.

In a preferred embodiment of this invention a light-emitting layer can be used between the hole transporting layer and the electron transporting layer (optionally) resp. cathode. Usually it is prepared by forming a thin film of an inventive DPP polymer on the hole transporting layer.

As methods for forming said thin film, there are, for example, the vacuum deposition method, the spin-coating method, the casting method, the Langmuir-Blodgett ("LB") method and the like. Among these methods, the vacuum deposition method, the spin-coating method and the casting method are particularly preferred in view of ease in operation and cost.

In case of forming a thin film using an inventive DPP polymer by means of the vacuum deposition method, the conditions under which the vacuum deposition is carried out are usually strongly dependent on the properties, shape and crystalline state of the compound. However, optimum conditions can be selected for example within the range of from 100 to 400° C. in temperature for the heating boat, −100 to 350° C. in substrate temperature, $1.33\times10^4$ Pa ($1\times10^2$ Torr) to $1.33\times10^{-4}$ Pa ($1\times10^{-6}$ Torr) in pressure and 1 pm to 6 nm/sec in deposition rate.

In an organic EL element, the thickness of the light emitting layer thereof is one of the factors determining its light emission properties. For example, if a light emitting layer is not sufficiently thick, a short circuit can occur quite easily between two electrodes sandwiching said light emitting layer, and therefor, no EL emission is obtained. On the other hand, if the light emitting layer is excessively thick, a large potential drop occurs inside the light emitting layer because of its high electrical resistance, so that the threshold voltage for EL emission increases. Accordingly, it is necessary to limit the thickness of an organic light emitting layer within the range of from 5 nm to 5 μm. A preferable thickness is within the range of from 10 nm to 500 nm.

In the case of forming a light emitting layer by using the spin-coating method and the casting method, the coating can be carried out using a solution prepared by dissolving the inventive DPP polymers in a concentration of from 0.0001 to 90% by weight in an appropriate organic solvent such as benzene, toluene, xylene, tetrahydrofurane, methyltetrahydrofurane, N,N-dimethylformamide, dichloromethane, dimethylsulfoxide and the like. Herein, the higher the concentration of the inventive DPP polymers, the thicker the resulting film, while the lower the concentration, the thinner the resulting film. However, if the concentration exceeds 90% by weight, the solution usually is so viscous that it no longer permits forming a smooth and homogenous film. On the other hand, as a rule, if the concentration is less than 0.0001% by weight, the efficiency of forming a film is too low to be economical. Accordingly, a preferred concentration of the inventive DPP polymers is within the range of from 0.01 to 80% by weight.

In the case of using the above spin-coating or casting method, it is possible to further improve the homogeneity and mechanical strength of the resulting layer by adding a polymer binder in the solution for forming the light emitting layer. In principle, any polymer binder may be used, provided that it is soluble in a solvent in which DPP 1 is dissolved. Examples of such polymer binders are polycarbonate, polyvinylalcohol, polymethacrylate, polymethylmeth-acrylate, polyester, polyvinylacetate, epoxy resin and the like. A solution for forming a light emitting layer may have any concentrations of the inventive DPP polymers, of a polymer binder and solvent. However, if the solid content composed of the polymer binder and inventive DPP polymer exceeds 99% by weight, the fluidity of the solution is usually so low that it is impossible to form a light emitting layer excellent in homogeneity. On the other hand, if the content of inventive DPP polymer is substantially smaller than that of the polymer binder, in general the electrical resistance of said layer is very large, so that it does not emit light unless a high voltage is applied thereto. Furthermore, since the concentration of inventive DPP polymer in the layer is small in this case, its light emission efficiency is relatively low. Accordingly, the preferred composition ratio of a polymer binder to inventive DPP polymer is chosen within the range of from 10:1 to 1:50 by weight, and the solid content composed of both components in the solution is preferably within the range of from 0.01 to 80% by weight, and more preferably, within the range of about 0.1 to 60% by weight.

In the case of forming a light-emitting layer by the spin-coating method or casting method, the thickness of said layer may be selected in the same manner as in the case of forming a light emitting layer by the vacuum deposition method. That is, the thickness of the layer preferably is chosen within the range of from 5 nm to 5 μm, and more preferably, within the range of from 10 nm to 500 nm.

As positive hole-transporting layers known organic hole transporting compounds such as polyvinyl carbazole,

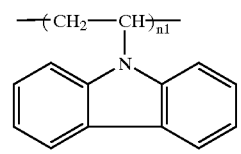

a triphenylamine derivative ("TPD") compound disclosed in J.Amer.Chem.Soc. 90 (1968) 3925

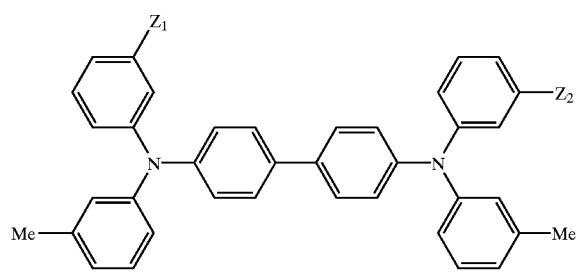

wherein $Z_1$ and $Z_2$ each represent a hydrogen atom or a methyl group;

a compound disclosed in J. Appl. Phys. 65(9) (1989) 3610

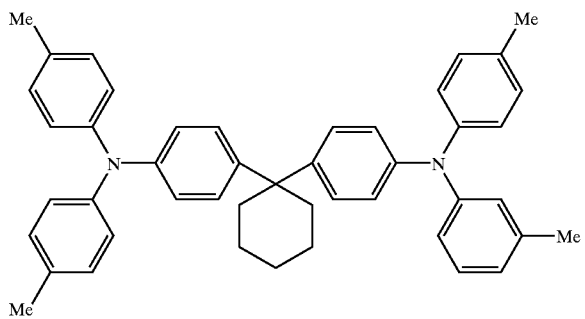

a stilbene based compound

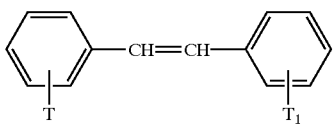

wherein T and $T_1$ stand for an organic rest, poly(dioxyethylene thienylene) ("PEDOT"), a hydrazone based compound

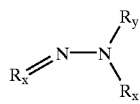

and the like.

Compounds to be used as a positive hole transporting material are not restricted to the above listed compounds. Any compound having a property of transporting positive holes can be used as a positive hole transporting material such as triazole derivatives, oxadiazole derivatives, imidazole derivatives, polyarylalkane derivatives, pyrazoline derivative, pyrazolone derivatives, phenylene diamine derivatives, arylamine derivatives, amino substituted chalcone derivatives, oxazole derivatives, stilbenylanthracene derivatives, fluorenone derivatives, hydrazone derivatives, stilbene derivatives, copolymers of aniline derivatives, electro-conductive oligomers, particularly thiophene oligomers, porphyrin compounds, aromatic tertiary amine compounds, stilbenyl amine compounds etc. Particularly, aromatic tertiary amine compounds such as N,N,N',N'-tetraphenyl-4,4'-diaminobiphenyl, N,N'-diphenyl-N,N'-bis(3-methylphenyl)- 4,4'-diaminobiphenyl (TPD), 2,2'-bis(di-p-torylaminophenyl)propane, 1,1'-bis(4-di-torylaminophenyl)-4-phenylcyclohexane, bis(4-dimethylamino-2-methylphenyl)phenylmethane, bis(4-di-p-tolylaminophenyl)phenyl-methane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quaterphenyl, N,N,N-tri(p-tolyl)amine, 4-(di-p-tolylamino)-4'-[4-(di-p-tolylamino)stilyl]stilbene, 4-N,N-diphenylamino-(2-diphenylvinyl)benzene, 3-methoxy-4'-N,N-diphenylaminostilbene, N-phenylcarbazole etc.

Furthermore, 4,4'-bis[N-(1-naphtyl)-N-phenylamino]biphenyl disclosed in U.S. Pat. No. 5,061,569, the compounds in which three triphenylamine units are bound to a nitrogen atom like "star-burst" structure e.g. 4,4',4"-tris[N-(3-methylphenyl)-N-phenylamino]triphenylamine disclosed in EP-A 508,562.

A positive hole transporting layer can be formed by preparing an organic film containing at least one positive hole transporting material on the anode. The positive hole transporting layer can be formed by the vacuum deposition method, the spin-coating method, the casting method, the LB method and the like. Of these methods, the vacuum deposition method, the spin-coating method and the casting method are particularly preferred in view of ease and cost.

In the case of using the vacuum deposition method, the conditions for deposition may be chosen in the same manner as described for the formation of a light emitting layer (see above). If it is desired to form a positive hole transporting layer comprising more than one positive hole transporting material, the coevaporation method can be employed using the desired compounds.

In the case of forming a positive hole transporting layer by the spin-coating method or the casting method, the layer can be formed under the conditions described for the formation of the light emitting layer (see above).

As in the case of forming a light emitting layer using a solution containing a polymer binder, a smoother and more homogeneous positive hole transporting layer can be formed by using a solution containing a binder and at least one positive hole transporting material. The coating using such a solution can be performed in the same manner as in cases of forming a light emitting layer using a polymer binder. Any polymer binder may be used, provided that it is soluble in a solvent in which at least one positive hole transporting material is dissolved. Examples of appropriate polymer binders and of appropriate and preferred concentrations are given above when describing the formation of a light emitting layer. The thickness of a positive hole transporting layer is preferably chosen in the range of from 0.5 to 1000 nm, preferably from 1 to 100 nm, more preferably from 2 to 50 nm.

As electron transporting materials for an electron-transporting layer it is preferred to have a high electron injection efficiency from the cathode and a high electron mobility. The following materials can be exemplified for electron transporting materials: tris(8-hydroxyquinolinoato)-aluminum(III) and its derivatives, bis(10-hydroxybenzo[h]quinolinolato)beryllium(II) and its derivatives, oxadiazole derivatives such as 2-(4-biphenyl)-5-(4-tert.-butylphenyl)-1,3,4-oxadiazole and its dimer systems such as 1,3-bis(4-tert.-butylphenyl-1,3,4)oxadiazolyl)-biphenylene and 1,3-bis(4-tert.-butylphenyl-1,3,4-oxadiazolyl)phenylene, triazole derivatives, phenanthroline derivatives or perylene tetracarboxylic acid derivatives such as disclosed in Appl. Phys. Lett. 48 (2) (1986)183.

An electron transporting layer can be formed by preparing an organic film containing at least one electron transporting material on the hole transporting layer or on the light-emitting layer. The electron transporting layer can be formed by the vacuum deposition method, the spin-coating method, the casting method, the LB method and the like.

As in the case of forming a light emitting layer or a positive hole transporting layer by using a solution containing a polymer binder, a smoother and more homogeneous electron transporting layer can be formed by using a solution containing a binder and at least one electron transporting material.

In general, the inventive polymers exhibit a molar absorption coefficient in the range of from $10^3$ to $10^6$ [$10^3$ cm$^2$ mol$^{-1}$].

A further preferred embodiment relates to the use of the inventive polymers in electronic and photonic devices such as diodes, light-emitting diodes, photodiodes, field-effect transistors, polymer grid triodes, light-emitting electrochemical cells, optocouplers and lasers.

A further embodiment of the present invention relates to electronic and photonic devices such as diodes, light-emitting diodes, photodiodes, field-effect transistors, polymer grid triodes, light-emitting electrochemical cells, optocouplers and lasers comprising the inventive polymers.

The inventive polymers exhibit an improved processability and an improved electroluminescence intensity by a factor of $10^2$ to $10^4$ with regard to poly(1,4-phenylene).

EXAMPLES

Example 1 x moles of 1,4-diketo-2,5-di(n-hexyl)-3,6-di(4-bromophenyl)pyrrolo-[3,4-c]pyrrole (prepared according to the method described in U.S. Pat. No. 4,579,949, e.g. in ex. 25 or 44), (x+y) moles of 2,5-di-n-hexylbenzene-1,4-bis (boronic acid) (prepared according Makromol. Chem. 191 (1990) 1991) and y moles of 2,5-dibromo-1,4-di-n-hexylbenzene (Synthesis (1988) 386–388) are dissolved in toluene (5 ml/mmol boronic acid derivative) under nitrogen and a 1 N solution of potassium carbonate in water (5 ml/mmol boronic acid derivative) is added. The solution is heated to reflux and tetrakistriphenyl-phosphino-Pd(0) (x/35 moles) in toluene (5 ml/mmol boronic acid derivative) is added. The mixture is refluxed for 24 hours and poured into acetone after cooling down to room temperature. After filtration the polymer is successively washed with acetone and aqueous HCl. Finally a solid, powder is obtained, which is soluble in chloroform, toluene and xylene. Thermal properties: no melting point, gradual decomposition above 250° C. For details of composition and characteristic properties see Table 1 below.

$^1$H-NMR; (CDCl$_3$): δ(ppm): 0.7–1.8 (CH$_2$, CH$_3$ of n-hexyl), 2.63 (α-CH$_2$ of n-hexyl at phenylene adjacent to DPP), 2.42 (α-CH$_2$ of n-hexyl at phenylene adjacent to another phenylene), 3.84 (α-CH$_2$ of n-hexyl at DPP), 7.19 (m, CH of phenylene), 7.55 (d, CH of DPP), 7.93 (d, CH of DPP). UV/VIS absorption (CHCl$_3$): $\lambda_{max}$=488 nm. Photoluminescence (CHCl$_3$): $\lambda_{max}$=544 nm.

Example 2

433.9 mg of 1,4-diketo-2,5-di(i-pentyl)-3,6-di(4-bromophenyl)pyrrolo-[3,4-c]pyrrole, 500.0 mg of 2,5-di-i-pentoxybenzene-1,4-bis(boronic acid) and 302.0 mg of 2,5-dibromo-1,4-di-i-pentoxylbenzene are dissolved in 20 ml of tetrahydrofurane under a nitrogen atmosphere and 20 ml of a 1 N solution of NaHCO$_3$ in water is added. The solution is heated to reflux and 17 mg of tetrakistriphenylphosphino-Pd(0) in 5 ml tetrahydrofurane are added. The mixture is refluxed for 72 h and poured into methanol after cooling down to room temperature. After filtration the polymer is washed with water and recrystallized from chloroform by addition of methanol. A dark red powder is obtained having a molecular weight of M$_w$=4500 g/mol (polymer 11, see Table below).

$^1$H-NMR (CDCl$_3$): δ(ppm): 0.7–1.6 (CH$_2$, CH$_3$ of i-pentyl), 3.89 (α-CH$_2$ of i-pentyl at DPP), 3.95 (α-CH$_2$ of i-pentoxy at phenylene), 6.9 and 7.0, 7.6, 7.76 and 7.9 (aromatic protons of DPP and phenylene); UV/VIS absorption (CHCl$_3$): $\lambda_{max}$=493, 305 nm. Fluorescence: $\lambda_{max}$=558 nm.

TABLE 1

Composition and characteristic properties of (co)polymers.

| Polymer | x | yield (%) | M$_w$[g/mol] | P$_w$ | colour |
|---|---|---|---|---|---|
| 1 | 1 | 69 | 5400 | 8 | deep orange |
| 2 | 0.65 | 73 | 6400 | 10 | orange |
| 3 | 0.50 | 84 | 21000 | 36 | orange |
| 4 | 0.45 | 79 | 19000 | 33 | orange |
| 5 | 0.25 | 71 | 6100 | 11 | orange |
| 6 | 0.10 | 65 | 9800 | 19 | pale orange |
| 7 | 0.05 | 62 | 3000 | 6 | pale orange |
| 8 | 0.01 | 58 | 2900 | 6 | brownish orange |
| 9 | 0.005 | 57 | 2700 | 6 | pale brown |
| 10 | 0 | 87 | 39000 | 80 | pale brown |
| 11 | 0.50 | 63 | 4500 | 7 | deep red |

P$_w$ is defined as M$_w$/M, wherein M is the molecular weight of the corresponding monomer unit resp. the weighted monomer unit depending on x and y. x is determined by $^1$H-NMR-spectroscopy of the inventive polymers in CDCl$_3$. Molecular weights are determined by size exclusion chromatography ("SEC") using a Waters/Millipore UV detector 481 and a SEC column combination (Latek/styragel 50/1000 nm pore size). All measurements are carried out in tetrahydrofurane at 45° C. The columns are calibrated versus commercially available polystyrene standards.

Example 3

83 mg of polymer 1 are dissolved in 4.5 ml of chloroform. A glass substrate coated with indium-tin-oxide (ITO) (100 nm) and poly(dioxyethylene thienylene) ("PEDOT")/PSS (Baytron P® from Bayer AG) (50 nm) is used and coated with a film of polymer 1 (thickness of film: 100 nm) using spin-coating; the coating conditions comprise 1500 rotations per min for 10 sec, the acceleration time being 1 sec, 2000 rotations per min for 20 sec, the acceleration being 1 sec and 1000 rotations per min for 30 sec, the delay time being 2 sec. Subsequently the film is coated with a layer of Al with a thickness of 50 nm using vapor deposition (pressure: 6·10$^{-6}$ mbar).

Electroluminescence measurements are carried out under an atmosphere of nitrogen using a HP 16442A test fixture with a home-made sample holder. The voltage is chosen in the range of from 0 to 20 V and the current is detected with a HP 4155A semiconductor parameter analyzer and the light power is measured using a Hamamatsu S2281-01 Silicon Photodiode. Electroluminescence spectra are measured using a LN/CCD detector equipped with an optical grating of 150 g/mm. At 15 V, the light power is 3·10$^{-2}$ mW/cm$^2$, the current density: 2·10$^{-1}$ A/cm$^2$ and $\lambda_{max}$=623 nm.

Example 4

120 mg of polymer 2 are dissolved in 5.5 ml of chloroform using spin-coating a film of a thickness of 100 nm is prepared on a glass substrate coated with ITO (100 nm) and PEDOT (50 nm); the coating conditions comprise 1500 rotations per min for 10 sec, the acceleration time being 1 sec, 2000 rotation per min for 20 sec, the acceleration being 1 sec and 1000 rotations per min for 30 sec, the delay time being 2 sec. Subsequently the film is coated with a layer of Al with thickness of 50 nm using vapor deposition (pressure: 6·10$^{-6}$ mbar).

Electroluminescence properties are determined as described in ex. 2: at 15 V, the light power is 8·10$^{-2}$ mW/cm$^2$, the current density: 5·10$^2$ A/cm$^2$, and $\lambda_{max}$=623 nm.

Example 5

80 mg of a polymer 3 are dissolved in 6 ml of chloroform. Using spin-coating a film of a thickness of 100 nm is prepared on a glass substrate coated with ITO (100 nm) and PEDOT (50 nm); the coating conditions comprise 1200 rotations per min for 10 sec, the acceleration time being 3 sec, 1800 rotations per min for 20 sec, the acceleration being 3 sec and 1000 rotations per min for 30 sec, the delay time being 2 sec. Subsequently the film is coated with a layer of Al with a thickness of 50 nm using vapor deposition (pressure: $6 \cdot 10^{-6}$ mbar).

Electroluminescence properties are determined as described in ex. 2: at 15 V, the light power is $5 \cdot 10^{-3}$ mW/cm$^2$, the current density: $5.5 \cdot 10^{-2}$ A/cm$^2$, and $\lambda_{max}$=623 nm.

Example 6

83 mg of polymer with 5 are dissolved in 6 ml of chloroform. Using spin-coating a film of a thickness of 100 nm is prepared on a glass substrate coated with ITO (100 nm) and PEDOT (50 nm); the coating conditions comprise 1800 rotations per min for 10 sec, the acceleration time being 1 sec, 2200 rotations per min for 20 sec, the acceleration being 1 sec and 1000 rotations per min for 30 sec, the delay time being 2 sec. Subsequently the film is coated with a layer of Al with a thickness of 50 nm using vapor deposition (pressure: $6 \cdot 10^{-6}$ mbar).

Electroluminescence properties are determined as described in ex. 2: at 15 V, the light power is $8 \cdot 10^{-4}$ mW/cm$^2$, the current density: $2 \cdot 10^{-3}$ A/cm$^2$, and $\lambda_{max}$=623 nm.

Example 7

120 mg of polymer 6 are dissolved in 6 ml of chloroform. Using spin-coating a film of a thickness of 100 nm is prepared on a glass substrate coated with ITO (100 nm) and PEDOT (50 nm); the coating conditions comprise 1500 rotations per min for 10 sec, the acceleration time being 1 sec, 2000 rotations per min for 20 sec, the acceleration being 1 sec and 1000 rotations per min for 30 sec, the delay time being 2 sec. Subsequently the film is coated with a layer of Al with a thickness of 50 nm using vapor deposition (pressure: $6 \cdot 10^{-6}$ mbar).

Electroluminescence properties are determined as described in ex. 2: at 15 V, the light power is $5 \cdot 10^{-4}$ mW/cm$^2$, the current density: $1.5 \cdot 10^{-3}$ A/cm$^2$, and $\lambda_{max}$=623 nm.

Example 8

The same procedure as in example 3 was applied, except that Ca (100 nm) instead of Al is deposited.

Electroluminescence properties are determined as described in ex. 2: at 15 V, the light power is $4 \cdot 10^{-3}$ mW/cm$^2$, the current density: $3 \cdot 10^{-3}$ A/cm$^2$, and $\lambda_{max}$=623 nm.

Example 9

85 mg of polymer 1 are dissolved in 5 ml of chloroform. Using spin-coating a film of a thickness of 50 nm is prepared on a glass substrate coated with FTO (100 nm); the coating conditions comprise 1800 rotations per min for 10 sec, the acceleration time being 1 sec, 2200 rotations per min for 20 sec, the acceleration being 1 sec and 1000 rotations per min for 30 sec, the delay time being 2 sec. Subsequently the film is coated with a layer of Al with a thickness of 50 nm using vapour deposition (pressure: $6*10^{-6}$ mbar).

Electroluminescence properties (under N$_2$) at 14V: $\lambda_{max}$=623 nm, light power: $3*10^{-3}$ W/cm$^2$, current density: $9*10^{-1}$ A/cm$^2$.

Example 10

70 mg of a polymer 3 are dissolved in 6 ml of chloroform. Using spin-coating a film of a thickness of 75 nm is prepared on a glass substrate coated with FTO; the coating conditions comprise 1500 rotations per min for 10 sec, the acceleration time being 1 sec, 200 rotations per min for 20 sec, the acceleration being 1 sec and 1000 rotations per min for 30 sec, the delay time being 2 sec. Subsequently the film is coated with a layer of Al with a thickness of 50 nm using vapour deposition (pressure: $6*10^{-6}$ mbar).

Electroluminescence properties (under N$_2$) at 20V: $\lambda_{max}$=623 nm, light power: $4*10^{-4}$ W/cm$^2$, current density: $4*10^{-2}$ A/cm$^2$.

Example 11

100 mg of polymer 2 are dissolved in 5.5 ml of chloroform. Using spin-coating a film of a thickness of 75 nm is prepared on a glass substrate coated with FTO; the coating conditions comprise 1800 rotations per min for 10 sec, the acceleration time being 1 sec, 2200 rotations per min for 20 sec, the acceleration being 1 sec and 1000 rotations per min for 30 sec, the delay time being 2 sec. Subsequently the film is coated with a layer of Al with a thickness of 50 nm using vapour deposition (pressure: $6*10^{-6}$ mbar).

Electroluminescence properties (under N$_2$) at 20V: $\lambda_{max}$=623 nm, light power: $2*10^{-4}$ W/cm$^2$, current density: $6*10^{-2}$ A/cm$^2$.

Example 12

88 mg of polymer 11 are dissolved in 4 ml of chloroform. Using spin-coating a film of a thickness of 100 nm is prepared on a glass substrate coated with ITO (100 nm) and PEDOT (~50 nm); the coating conditions comprise 1500 rotations per min for 10 sec, the acceleration time being 3 sec, 2000 rotations per min for 20 sec, the acceleration being 1 sec and 1000 rotations per min for 30 sec, the delay time being 2 sec. Subsequently the film is coated with a layer of Al with a thickness of 50 nm using vapour deposition (pressure: $6*10^{-6}$ mbar).

Electroluminescence properties (under N$_2$) at 20V: Broad El-Spectrum with $\lambda_{max}$=727 nm, light power: $2*10^{-4}$ mW/cm$^2$, current density: $1*10^{-1}$ A/cm$^2$.

Example 13

88 mg of polymer 11 are dissolved in 4 ml of chloroform. Using spin-coating a film of a thickness of 100 nm is prepared on a glass substrate coated with ITO (100 nm), the coating conditions comprise 1500 rotations per min for 10 sec, the acceleration time being 3 sec, 2000 rotations per min for 20 sec, the acceleration being 1 sec and 1000 rotations per min for 30 sec, the delay time being 2 sec. Subsequently the film is coated with a layer of Al with a thickness of 50 nm using vapour deposition (pressure: $6*10^{-6}$ mbar).

Electroluminescence properties (under N$_2$) at 20V: Broad El-Spectrum with $\lambda_{max}$=727 nm, light power: $1.5*10^{-4}$ mW/cm$^2$, current density: $3*10^{-1}$ A/cm$^2$.

What is claimed is:
1. A diketopyrrolopyrrole based polymer comprising the following units

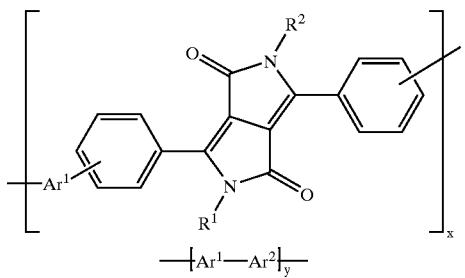

wherein x is chosen in the range of from 0.005 to 1, and y is from 0.995 to 0, and wherein x+y=1, and wherein $Ar^1$ and $Ar^2$ independently from each other stand for

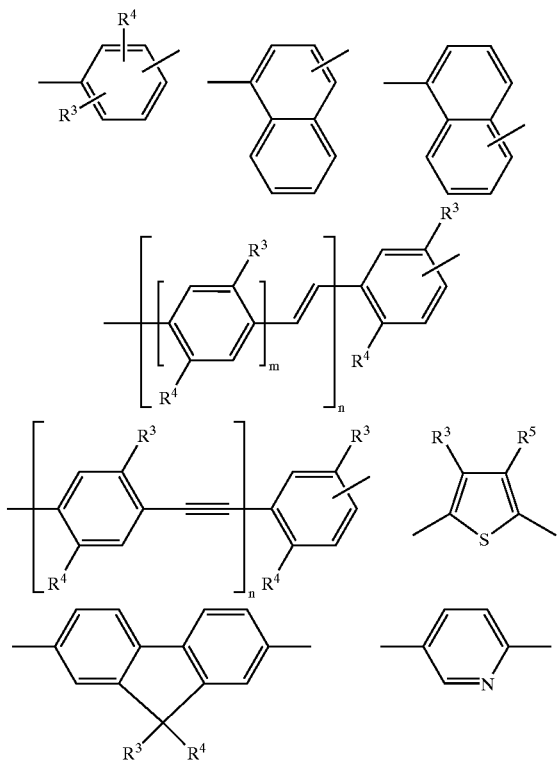

and m, n being numbers from 1 to 10, and $R^1$ and $R^2$ independently from each other stand for H, $C_1$–$C_{18}$ alkyl, —C(O)O—$C_1$–$C_{18}$ alkyl, perfluoro-$C_1$–$C_{12}$alkyl, unsubstituted $C_6$–$C_{12}$aryl, $C_6$–$C_{12}$aryl which is substituted by one to three radicals selected from the group consisting of $C_1$–$C_{12}$alkyl, $C_1$–$C_{12}$alkoxy and halogen, or $C_6$–$C_{12}$aryl-$C_1$–$C_{12}$alkyl, $R^3$ and $R^4$ stand for hydrogen, $C_1$–$C_{12}$ alkyl, $C_1$–$C_{12}$ alkoxy, unsubstituted $C_6$–$C_{12}$aryl, $C_6$–$C_{12}$aryl which is substituted by one to three radicals selected from the group consisting of $C_1$–$C_{12}$alkyl, $C_1$–$C_{12}$alkoxy and halogen, or perfluoro-$C_1$–$C_{12}$alkyl, and $R^5$ stands for $C_1$–$C_{12}$ alkyl, $C_1$–$C_{12}$ alkoxy, unsubstituted $C_6$–$C_{12}$aryl, $C_6$–$C_{12}$aryl which is substituted by one to three radicals selected from the group consisting of $C_1$–$C_{12}$alkyl, $C_1$–$C_{12}$alkoxy and halogen, or perfluoro-$C_1$–$C_{12}$alkyl.

2. A diketopyrrolopyrrole based polymer according to claim 1 comprising the following units

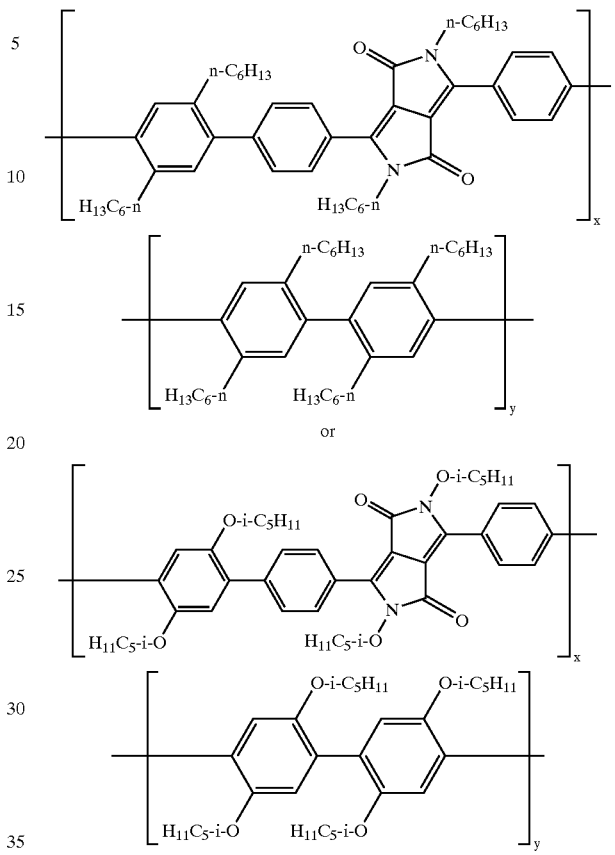

3. Process for the preparation of a DPP polymer which comprises reacting a DPP derivative of formula II

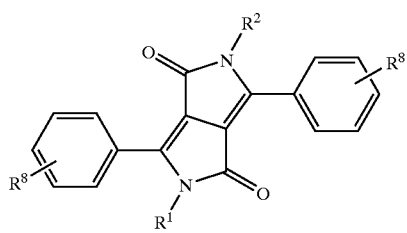

wherein $R^1$ and $R^2$ independently from each other stand for H, $C_1$–$C_{18}$ alkyl, —C(O)O—$C_1$–$C_{18}$ alkyl, perfluoro-$C_1$–$C_{12}$alkyl, unsubstituted $C_6$–$C_{12}$aryl, $C_6$–$C_{12}$aryl which is substituted by one to three radicals selected from the group consisting of $C_1$–$C_{12}$alkyl, $C_1$–$C_{12}$alkoxy and halogen, or $C_6$–$C_{12}$aryl-$C_1$–$C_{12}$alkyl, and $R^8$ stands for halogen, or E having the meaning of

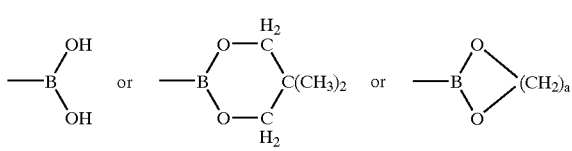

wherein a is 2 or 3, with boronic acid derivative III

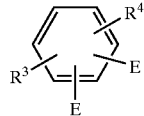

III or—in case $R^8$ is not halogen—with compound IIIa

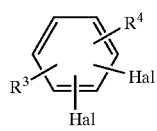

IIIa wherein Hal stands for halogen, and $R^3$ and $R^4$ stand for hydrogen, $C_1$–$C_{12}$ alkyl, $C_1$–$C_{12}$ alkoxy, unsubstituted $C_6$–$C_{12}$aryl, $C_6$–$C_{12}$aryl which is substituted by one to three radicals selected from the group consisting of $C_1$–$C_{12}$alkyl, $C_1$–$C_{12}$alkoxy and halogen, or perfluoro-$C_1$–$C_{12}$alkyl, and optionally with dihalophenyl compound IV

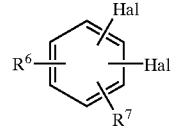

IV wherein $R^6$ and $R^7$, independently from each other have the meaning of n-$C_6H_{13}$ or —O-i-$C_5H_{11}$.

4. A method for preparing an electronic or photonic device comprising incorporating a polymeric layer having a diketopyrrolopyrrole based polymer according to claim 1.

5. An electroluminescent device comprising
  (i) an anode/a hole transporting layer/an electron transporting layer/a cathode in which the hole transporting layer or the electron transporting layer also functions as a light-emitting layer, and the diketopyrrolopyrrole based polymer according to claim 1 is used in the layer that also functions as a light-emitting layer, or comprising
  (ii) an anode/a hole transporting layer/a light-emitting layer/optionally an electron transporting layer/a cathode, in which the light-emitting layer comprises the diketopyrrolopyrrole based polymer according to claim 1.

6. Mixture of a DPP based polymer according to claim 1 and at least another polymer compatible therewith.

7. A mixture of a DPP-based polymer according to claim 2 and at least another polymer compatible therewith.

8. A DPP-based polymer according to claim 1, wherein x is in the range of from 0.01 to 1.

9. A DPP-based polymer according to claim 1, wherein y is from 0.99 to 0.

* * * * *